United States Patent [19]
Ramet

[11] Patent Number: 4,833,420
[45] Date of Patent: May 23, 1989

[54] LOW-PASS FILTER FOR INTEGRATED CIRCUIT

[75] Inventor: Serge Ramet, Grenoble, France

[73] Assignee: SGS-Thomson Microelectronics S.A., Gentilly, France

[21] Appl. No.: 143,620

[22] PCT Filed: Apr. 10, 1987

[86] PCT No.: PCT/FR87/00117
§ 371 Date: Dec. 10, 1987
§ 102(e) Date: Dec. 10, 1987

[87] PCT Pub. No.: WO87/06405
PCT Pub. Date: Oct. 22, 1987

[30] Foreign Application Priority Data

Apr. 11, 1986 [FR] France ................................. 86 05237

[51] Int. Cl.$^4$ .............................................. H03F 3/04
[52] U.S. Cl. ...................................... 330/107; 330/302
[58] Field of Search ............... 330/107, 109, 294, 302, 330/303

[56] References Cited

U.S. PATENT DOCUMENTS 4,684,832  8/1987  Little et al. ........................ 330/303

Primary Examiner—Gene Wan
Attorney, Agent, or Firm—Oblon, Fisher, Spivak, McClelland & Maier

[57] ABSTRACT

A low-pass filtering cell is disclosed. This cell uses a distributed capacitance resistive line having an intermediate tap to which a feedback capacitor is connected, the resistive line being connected to the input of an operational amplifier. The intermediate tap is positioned at one third of the length of the line to reduce the overall space factor of the cell to the minimum while, at the same time, obtaining the flattest possible response curve.

2 Claims, 1 Drawing Sheet

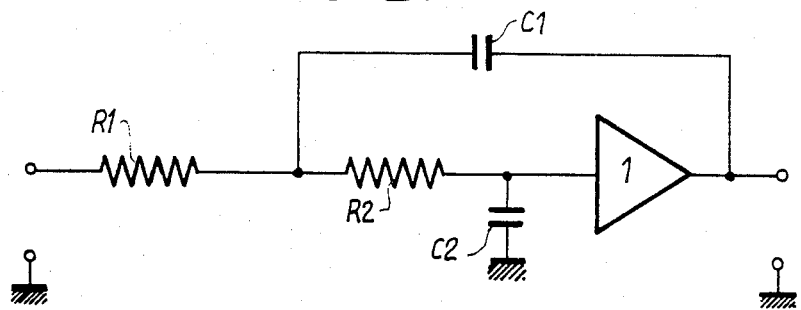
FIG_1 PRIOR ART
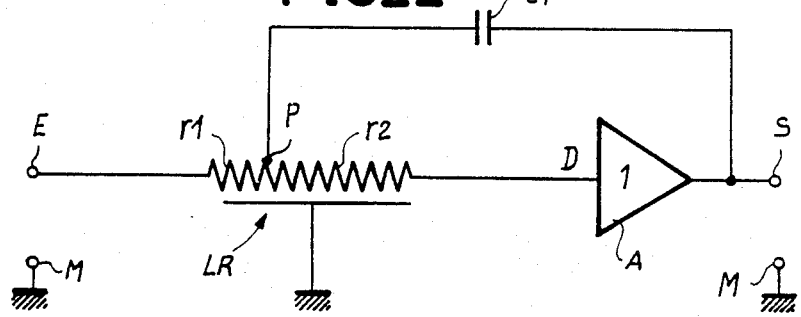
FIG_2
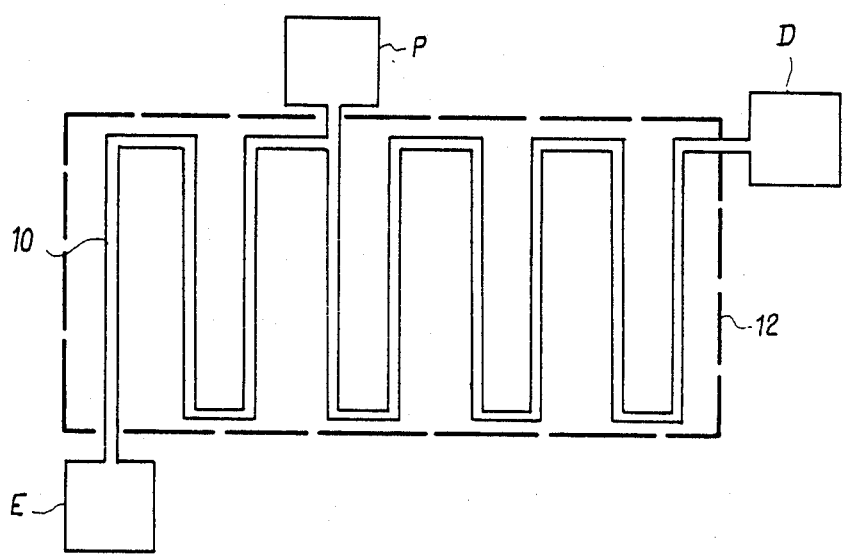
FIG_3

LOW-PASS FILTER FOR INTEGRATED CIRCUIT

BACKGROUND OF THE INVENTION

1. Field of the Invention

The invention pertains to a low-pass filter specially designed to be made in the form of an integrated circuit.

A very commonly used second-order low-pass filter cell is the so-called Sallen and Key cell shown in FIG. 1. It has two resistors R1, R2, two capacitors C1, C2 and a unit gain amplifier with high input impedance and low output impedance.

2. Description of the Prior Art

The values of the resistors and capacitors regulate the shape of the frequency response curve of this cell. A response curve shape that is often sought to be obtained is the one corresponding to a second-order transfer function called the Butterworth transfer function, namely a transfer function with a damping coefficient equal to the converse of the square root of 2. For this special transfer function corresponds to the flattest possible response curve in the pass-band (there being no surge voltage near the cut-off frequency).

It can be shown that, for the Sallen and Key cell of FIG. 1, this special response curve is obtained on condition that the value of the capacitor C1 is twice that of the capacitor C2 and on condition that the resistors R1 and R2 have the same value:

C1=2C2 and R1=R2.

If the resistors R1 and R2 are made by a diffusion of low-concentrated P-type impurities in a monocrystalline silicon substrate, a low space factor is got for the cell. However, this is got at the cost of a certain distortion of the signal owing to the non-linearity of these resistors.

If the resistors R1 and R2 are made of polycrystalline silicon, the non-linearity and distortion disappear but then the resistors as well as the capacitors take up considerably more space. In one example, it was observed that, to obtain the same response curve, it was necessary in one case (using polycrystalline silicon) to have resistors that were 40 times bulkier and capacitors that were 6 times bulkier than in the other case (with P−).

Other arrangements of filters with distributed constants have been proposed. These filters are designed to fulfill the same overall low-pass filtering function, but do so using circuit elements with distributed resistances and capacitances instead of the circuit of FIG. 1 which has resistances and capacitances that are clearly distinct from one another. These arrangements using distributed constants have been proposed in order to improve the attenuation beyond the cut-off frequency. For their attention may be exponential and, therefore, better than the attenuation of a true second-order filter such as the Sallen and Key cell.

The element with distributed constants may typically be a polycrystalline silicon line (displaying a certain degree of resistance) formed by etching a resistive layer of polycrystalline silicon, insulated by a dielectrical thin film of a conducting layer of polycrystalline silicon or any other conducting layer constituting a plate of a capacitor, the other plate of which is a relative line.

But the low-pass filtering cells with distributed constants proposed until now are not of very high quality as regards the overall space factor of the cell for a given response curve shape (especially for a given cut-off frequency).

SUMMARY OF THE INVENTION

The invention proposes a low-pass filtering cell with distributed constants which is an improvement in terms of space factor (for a given technology) as compared with cells of the prior art.

The cell according to the invention comprises a unit gain amplifier with high input impedance and low output impedance, a resistive line having an input, an output and an intermediate tap, the said line being placed above a conducting plate so as to exhibit a distributed capacitance with respect to this plate, the input of the line constituting the input of the filtering cell, the output of the line being connected to the input of the amplifier, the output of the amplifier constituting the output of the cell and being connected by a capacitor to the intermediate tap, the resistance of the line between the line input and the intermediate tap representing a fraction of 0.2 to 0.49, or preferably 0.27 to 0.4 and, if possible, close to $\frac{1}{3}$ of the overall resistance of the line.

BRIEF DESCRIPTION OF THE DRAWINGS

Other features and advantages of the invention will emerge from the following detailed description which is made with reference to the appended drawings, of which:

FIG. 1, already described, shows a Sallen and Key filtering cell,

FIG. 2 shows a cell according to the invention,

FIG. 3 shows a way of making the distributed constant resistive line needed in the cell according to the invention.

DESCRIPTION OF A PREFERRED EMBODIMENT

The cell of FIG. 2 has a unit gain amplifier A with high input impedance and low output impedance, a capacitor C1 and a resistive line with distributed constants LR.

The input of the cell is designated by E, the output by S and the input and output signals are voltages with respect to a ground M.

The resistive line with distributed constants comprises:

A resistive line proper,

A conducting plate connected to the ground M, the resistive line being insulated from the conducting plate by a thin dielectric so that there is a capacitance between the resistive line and the conducting plate, the said capacitance being distributed throughout the length of the line, An intermediate tap P making it possible to connect into the resistive line at a point located between the input and output of the line.

The input of the resistive line LR is connected to the input E of the cell. The output of the resistive line LR is connected to the input D of the amplifier A. The output of the cell is formed by the output of the amplifier A.

The capacitor C1 is connected between the output of the amplifier and the intermediate tap P.

According to the invention, to reduce the space factor of the cell to the minimum (for a given technology) while at the same time having the flattest possible response curve (in particular without surge voltage near the cut-off frequency) the intermediate tap P is located not in the middle of the resistive line as a comparison with the Sallen and Key cell might suggest. Rather, the intermediate tap P is located closer to the input of the cell at a position such that the ratio $r1/(r1+r2)$ between the resistance $r1$ of the line portion located between the points E and P and the total resistance $(r1+r2)$ of the line between the points E and D ranges between 0.2 and 0.49 or, better still, between 0.27 and 0.4, and preferably as close as possible to $\frac{1}{3}$.

FIG. 3 gives a schematic view of an embodiment of the resistive line with distributed constants LR.

The line consists of a resistive strip 10 of polycrystalline silicon forming a top layer. This strip goes above a conducting layer 12 which may consist of a bottom layer of polycrystalline silicon. The bottom layer is present everywhere beneath the resistive line. It is preferably made in the shape of a rectangle of polycrystalline silicon with a width far greater than that of the strip 10 (unless the bottom layer 12 has very low resistivity which makes it possible to limit the bottom layer 12 to the form of a strip extending beneath the strip 10).

The bottom and top layers are separated by a thin dielectric layer, for example, a silicon oxide. The farthest terminals of the line as well as the intermediate tap consist of enlarged pads of the top layer of polycrystalline silicon. These pads may be connected to metallic contacts through which they are connected to other circuit elements and, more especially, to the input E of the cell, the input D of the amplifier and the capacitor C1.

It can be shown that the space factor gained by the cell according to the invention may be 15% to 20% as compared with a Sallen and Key cell using polycrystalline silicon resistors. This gain is very high for integrated circuits.

What is claimed is:

1. A low-pass filtering cell comprising a unit gain amplifier with high input impedance and low output impedance, a resistive line with distributed capacitance and a capacitor, the said resistive line having an input which constitutes an input for the cell, an output connected to the input of the amplifier, and an intermediate tap connected by means of the capacitor to the output of the amplifier, the said resistive line being placed above a conducting plate from which it is insulated by a thin dielectric to constitute, between the line and the plate, a capacitance distributed along the line, the intermediate tap being located at a position such that the fraction $r1/(r1+r2)$ of the resistance $r1$ of the line between the input of the cell and the intermediate tap with respect to the overall resistance $(r1+r2)$ of the line ranges from 0.2 to 0.49.

2. A low-pass filtering cell according to the claim 1 wherein the said fraction is very close to $\frac{1}{3}$.

* * * * *